US008115660B2

(12) United States Patent
Kaufman et al.

(10) Patent No.: US 8,115,660 B2
(45) Date of Patent: Feb. 14, 2012

(54) COMPRESSION OF STREAM DATA USING A HIERARCHICALLY-INDEXED DATABASE

(75) Inventors: Lev S. Kaufman, Highland Park, NJ (US); Murali Rangarajan, South Planfield, NJ (US); Shirish H. Phatak, Somerset, NJ (US)

(73) Assignee: Packeteer, Inc., Cupertino, CA (US)

( * ) Notice: Subject to any disclaimer, the term of this patent is extended or adjusted under 35 U.S.C. 154(b) by 818 days.

(21) Appl. No.: 12/212,846

(22) Filed: Sep. 18, 2008

(65) Prior Publication Data

US 2009/0019345 A1 Jan. 15, 2009

Related U.S. Application Data

(63) Continuation of application No. 11/674,418, filed on Feb. 13, 2007, now Pat. No. 7,443,321.

(51) Int. Cl.
*H03M 7/30* (2006.01)

(52) U.S. Cl. .............................. 341/87; 341/51; 714/807

(58) Field of Classification Search .................... 341/87; 714/807

See application file for complete search history.

(56) References Cited

U.S. PATENT DOCUMENTS

| | | | | |
|---|---|---|---|---|
| 5,247,524 | A * | 9/1993 | Callon | 714/807 |
| 5,539,879 | A | 7/1996 | Pearce et al. | 714/47 |
| 5,832,520 | A | 11/1998 | Miller | 707/203 |
| 5,978,805 | A | 11/1999 | Carson | 707/10 |
| 5,990,810 | A | 11/1999 | Williams | 341/51 |
| 6,307,488 | B1 | 10/2001 | Cooper | 341/51 |
| 6,609,224 | B1 * | 8/2003 | Jonsson | 714/758 |
| 6,728,930 | B2 * | 4/2004 | Poeluev | 714/807 |
| 7,003,714 | B1 | 2/2006 | Sundaram et al. | 714/769 |
| 7,113,963 | B1 | 9/2006 | McCaw | 707/204 |
| 7,114,027 | B2 | 9/2006 | Gilfix et al. | 711/108 |
| 2005/0091234 | A1 | 4/2005 | Hsu et al. | 707/100 |

OTHER PUBLICATIONS

Adler-32, Wikipedia, the free encyclopedia, http:/en.wikipedia.org/wiki/Adler32, 3 pages, Feb. 13, 2007.

* cited by examiner

*Primary Examiner* — Khai M Nguyen
(74) *Attorney, Agent, or Firm* — Baker Botts L.L.P.

(57) ABSTRACT

The present invention, in particular embodiments, is directed to methods, apparatuses and systems that provide an efficient compression technique for data streams transmitted to storage devices or over networks to remote hosts. Local storage as well as network transmission of streams is made more efficient by awareness and utilization of repeated sequences of data blocks. Such data blocks can be placed in a dictionary on persistent storage and shared across all streams. The dictionary is hierarchically indexed (two or more levels of indexing) to combine high efficiency search with efficient access to the stored data blocks. Additionally, data blocks, in particular implementations, are stored sequentially in order to improve overall performance.

33 Claims, 9 Drawing Sheets

COMPRESSION OF STREAM DATA USING A HIERARCHICALLY-INDEXED DATABASE

CROSS-REFERENCE TO RELATED APPLICATION

The present application is a continuation of U.S. application Ser. No. 11/674,418, filed Dec. 13, 2007, which is incorporated by reference herein for all purposes.

TECHNICAL FIELD

The present disclosure generally relates to data compression.

BACKGROUND

Some data compression techniques, used in both data storage and network compression technologies, are based on so called stateless algorithms such as gzip or zlib. Gzip and zlib are software implementations of variants of the Lempel-Ziv algorithm. While these algorithms have some desirable characteristics (such as the fact that the decompressor does not require knowledge of a dictionary), they provide poor compression for several common data types since they ignore long-term temporal correlations between the data. For example, a Microsoft Word® file is edited incrementally and a new copy is saved or sent over a network. The new version closely resembles the old version. A stateless compression algorithm, however, may not take advantage of the redundancy between the two copies.

Certain replication oriented products do provide more efficient means of transmission by using so called differencing techniques. A disadvantage of differencing techniques is that they typically only work on files and not streams of data, which have no clear beginning or end, that typically need to be processed online as bytes are seen rather than offline when a whole file is available. Another disadvantage of differencing techniques is that they need to know a priori the "basis" against which to difference (e.g. if a file is renamed it can not be differenced properly). Some improvements for the basis problem are available such as a database of files used to locate suitable candidates or an extended file can be created at a known location to serve as an additional basis for storing recently seen blocks. However, neither technique works on streams. Additionally, neither helps with optimizing local storage of data.

In view of the foregoing, a need exists in the art for the aforementioned deficiencies.

SUMMARY

The present invention, in particular embodiments, is directed to methods, apparatuses and systems that provide an efficient compression technique for data streams transmitted to storage devices or over networks to remote hosts. Local storage as well as network transmission of streams is made more efficient by awareness and utilization of repeated sequences of data blocks. Such data blocks can be placed in a dictionary on persistent storage and shared across all streams. The dictionary is hierarchically indexed (two or more levels of indexing) to combine high efficiency search with efficient access to the stored data blocks. Additionally, data blocks, in particular implementations, are stored sequentially in order to improve overall performance.

The following embodiments and aspects thereof are described and illustrated in conjunction with systems, apparatuses and methods which are meant to be exemplary and illustrative, not limiting in scope. In various embodiments, one or more of the above-described problems have been reduced or eliminated. In addition to the aspects and embodiments described above, further aspects and embodiments will become apparent by reference to the drawings and by study of the following descriptions.

BRIEF DESCRIPTION OF THE DRAWINGS

Example embodiments are illustrated in referenced figures of the drawings. It is intended that the embodiments and figures disclosed herein are to be considered illustrative rather than limiting.

DETAILED DESCRIPTION

The following embodiments and aspects thereof are described and illustrated in conjunction with systems, apparatuses and methods which are meant to be illustrative, not limiting in scope.

Figure 4:
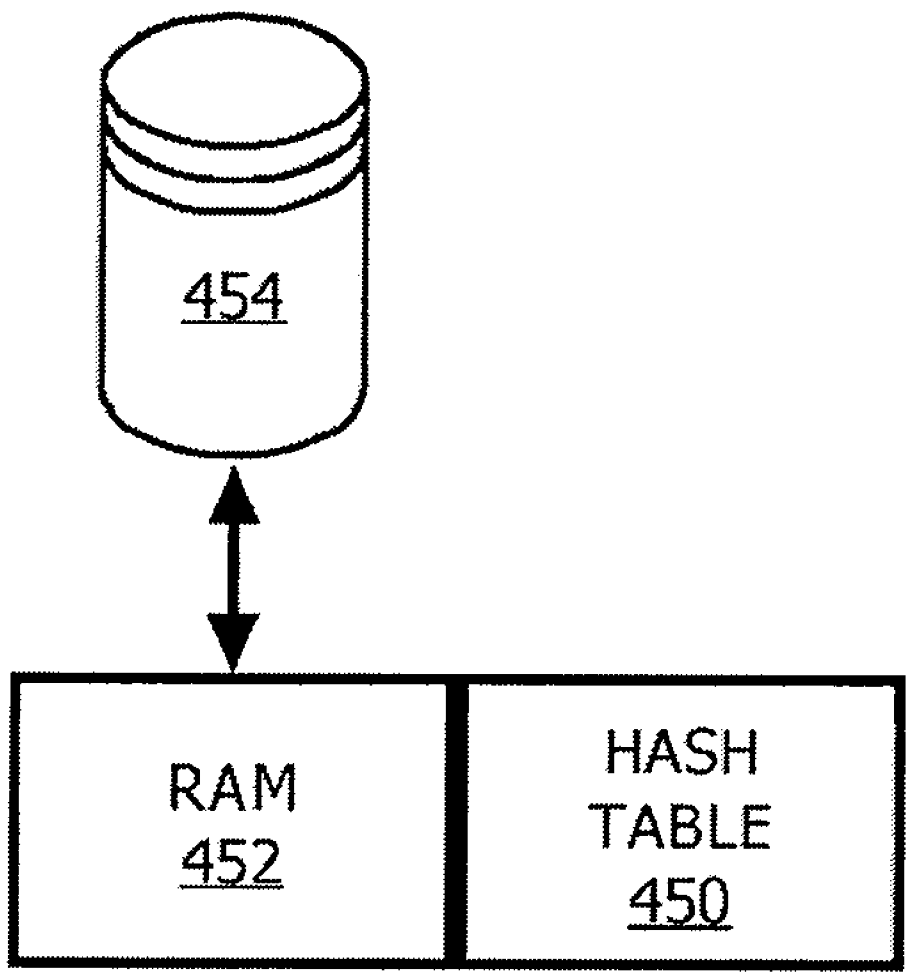
FIG. 4 is a block diagram illustrating how various data structures of the compression system are stored between random access and persistent memory, in accordance with an example embodiment.

Aspects of the claimed embodiments are directed to a compression module that processes a data stream sequentially as a series of data blocks. As new blocks of data, of a sufficient size, are seen, the compression module places them in a hierarchically-indexed database of fixed-sized data blocks. The database has a first-level index that includes a hash table of hashed weak checksums of data blocks. The hashed weak checksums point to a second level index of the database that includes strong checksums of the data blocks and locations of the data blocks in the database. The first-level index is typically maintained in memory, such as system memory 214 of FIG. 9, while the second-level index is typically maintained in a persistent storage such as mass storage device 218 of FIG. 9. This is further illustrated via FIG. 4 which shows the hash table 450 residing in RAM 452 while the second-level index of the database resides in storage device 454. In one implementation, upon system startup, the first-level index is read into memory and updated as the in memory copy is changed. Of course, in some implementations, portions of the second level index may be selectively cached in system memory 214 during compression and decompression operations.

For compression, as an input data stream is processed, the compression module incrementally calculates a weak checksum as a block-sized window shifts byte to byte. If a resulting weak checksum for a data block matches a weak checksum in the database then the compression module calculates a strong checksum. If the strong checksum also matches the database strong checksum then the compression module sends a signature of that data block instead of the data block itself. In one implementation, the signature is a combination of the weak and strong checksums. When the compression module inserts a new data block into the database, the compression module sends the new data block to the remote peer along with an insert command or other indication. When subsequent blocks match the inserted data block, the compression module sends a signature. In another embodiment, the compression module sends a signature after the new data block has been inserted instead of sending the new data block.

One example of a weak checksum is Adler32. Adler-32 is a checksum algorithm which was invented by Mark Adler. It is almost as reliable as a 32-bit cyclic redundancy check for protecting against accidental modification of data, such as distortions occurring during a transmission, but is significantly faster to calculate in software. However, weak checksums do have a higher collision probability in comparison to strong checksums. Adler32 also has the attribute of essentially allowing for a sliding window or rolling checksum. Restated, a weak checksum can be recomputed as the window slides by inputting into the checksum algorithm what byte value is omitted and what byte is added.

Examples of strong checksums include MD4, MD5 and SHA. MD4 is a message digest algorithm (the fourth in a series) designed by Professor Ronald Rivest of MIT in 1990. It implements a cryptographic hash function for use in message integrity checks and has a digest length is 128 bits. MD5 (Message-Digest algorithm 5) is a widely used cryptographic hash function with a 128-bit hash value. As an Internet standard (RFC 1321), MD5 has been employed in a wide variety of security applications, and is also commonly used to check the integrity of files. An MD5 hash is typically a 32-character hexadecimal number. SHA (Secure Hash Algorithm) hash functions refer to five FIPS-approved algorithms (Federal Information Processing Standards) for computing a condensed digital representation (known as a message digest) that is, to a high degree of probability, unique for a given input data sequence (the message).

Computation of weak checksums is not computationally intense. Due to this, the computation is very efficient. Additionally, the hash table of the database is stored in memory, in one implementation, which further reduces computation time to do a first matching operation via the weak checksum. The second level of the database is not hashed and can be implemented via a non-hash index such as B-tree or other efficient access structures. Additionally, in one implementation, the signature can be a logical index location of a data block in the database.

To achieve high compression ratios, a data block size should preferably be relatively large in comparison to sizes of the weak and large checksums.

The separation of having the hash-based search in memory and the data blocks in persistent storage advantageously preserves "locality of reference." Data blocks often repeat and also appear in clusters. Hashing weak checksums, alone, does not take advantage of locality of reference which in turn can degrade system performance when a persistent storage device is busy seeking clustered blocks in disparate locations. Locality of reference can also be facilitated by inserting data blocks when a minimum number of data blocks have accumulated in a buffer. In another implementation, a buffer timer can be utilized to signal when to write accumulated data blocks to a mass storage device.

Figure 1:
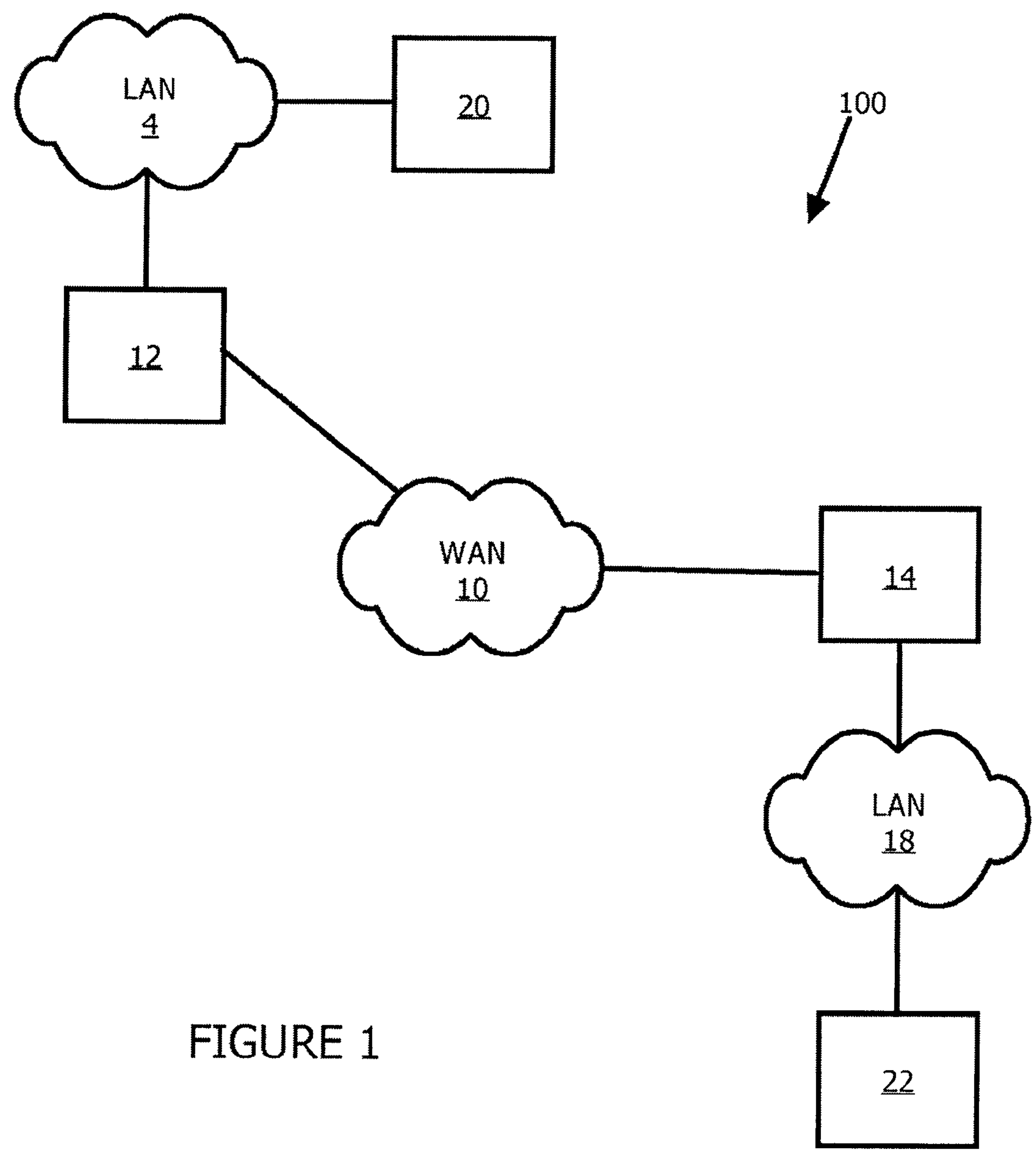
FIG. 1 is a block diagram illustrating an example network environment in which particular embodiments of the invention can be deployed.

FIG. 1 illustrates example components in a data compression system. In a specific embodiment, the system includes a gateway 12 operatively coupled to one or more hosts 20 via a network 4. The system also includes another gateway 14 coupled to one or more hosts 22 via a network 18. The gateways 12 and 14 are coupled by a network 10, and are disposed in the communications path between a plurality of hosts (e.g., hosts 20, 22). Hosts 20, 22 may be server systems, client systems or intermediate nodes. As described in more detail below, the gateways 12, 14, in one implementation, include a compression module operative to perform compression and decompression functionalities when transmitting and receiving data over the network 10. The compression and decompression functionalities of the compression module, however, may be located at any appropriate location such as an end host 20 and 22, or at an intermediate device such as gateways 12 and 14. Furthermore, the gateways 12 and 14 may employ some form of encapsulation (such as General Routing Encapsulation (GRE), etc.) to tunnel compressed data streams to each other. Furthermore, each gateway 12, 14 may operate in connection with one or more additional gateways (not shown). In such implementations, the gateways are each operative to maintain the state of the dictionaries relative to each remote gateway it operates with to compress and/or decompress data streams.

In one implementation, each of networks 4, 10 and 18, generally refer to a computer network, such as a LAN, a WAN, etc., that may include one or more intermediate network devices (e.g., routers, switches, etc.), which allow for the transmission of data and/or messages. FIG. 1 illustrates one possible data transmission environment in which the embodiments may operate; however, other implementations are possible such as the local storage environment of FIG. 2 which will be described in a subsequent section.

The gateways (12, 14) are operative to intercept connections between clients 20 and 22. The gateways also maintain closely identical or synchronized databases. The compression gateways (12, 14), in some embodiments, may also provide bandwidth controls to maintain overall WAN performance. When a new data block is sent from one compression gateway to the other, a command is included with the new data block that directs the compression gateway that receives the new data block to insert the new data block into that compression gateway's database. If a later data block is a match, at either end, a signature is then sent instead of the data block. Additionally, the database can be enabled to keep track of which data blocks were sent to specific compression gateways. This is accomplished via a bitmap that is included in a data block record. By using bitmaps, just one database needs to be maintained for multiple destination clients. This also results in a reduction of storage requirements.

One advantage of the network embodiment is that once a data stream is compressed and transmitted, and received and decompressed, there is generally no need to subsequently re-construct it since it is not persisted to a storage medium. Accordingly, any checksum collisions that occur in the blocks can be handled by simply overwriting the older blocks.

In one implementation, if a data block is not present in a database when a signature is received, the compression gateway that received the signature sends a request to the sender to send the data block. In another implementation, new data blocks are not inserted into the database when certain network congestion thresholds are met.

Figure 2:
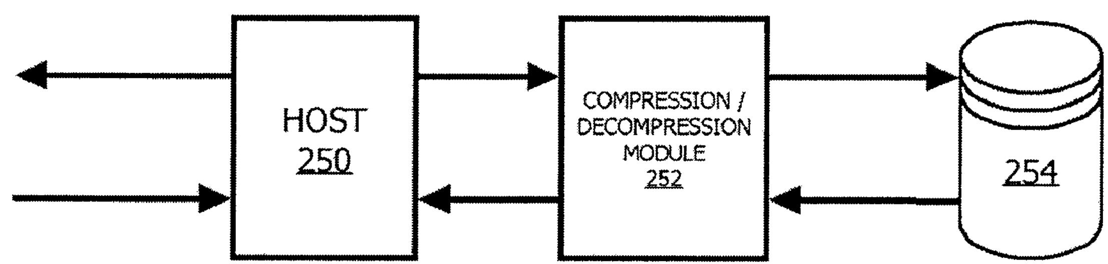
FIG. 2 is a block diagram illustrating a local storage example that can utilize embodiments of the invention.

Another embodiment involves using the hierarchically-indexed database for a local storage device of a host, such as host 250 and mass storage device 254 of FIG. 2. FIG. 2 also includes a compression/decompression module 252 situated between the host 250 and the mass storage device 254. It should be noted that module 252 and the mass storage device 254 are merely being shown as being separate from the host 250 for ease of illustration. Module 252 and the mass storage device 254 can be separate from host 250 or integrated into the host 250.

Module 252 maintains the hierarchical database to provide compression of data streaming from the host 250 to be stored on a mass storage device 254. The mass storage device may be local to the client or remotely connected via a Storage Area Network (SAN) or other network. Module 252 is also operative to decompress data being read by the host 250 from the mass storage device 254. Similar to the network embodiment, when a new data block is discovered, weak and strong checksums are calculated, the new data block with the checksums is entered into the database and a signature is stored in the mass storage device 254. When that same data block is later requested via a request of the signature, the signature is sent. In this embodiment, data compression is achieved at the mass storage device 254 by avoiding duplication of the same blocks of data. Certain data blocks will only be written once into the database and one or more corresponding signatures are stored on the mass storage device 254 as needed. It should also be noted that part of the database is maintained on mass storage device 254 or perhaps some other mass storage device.

Figure 3:
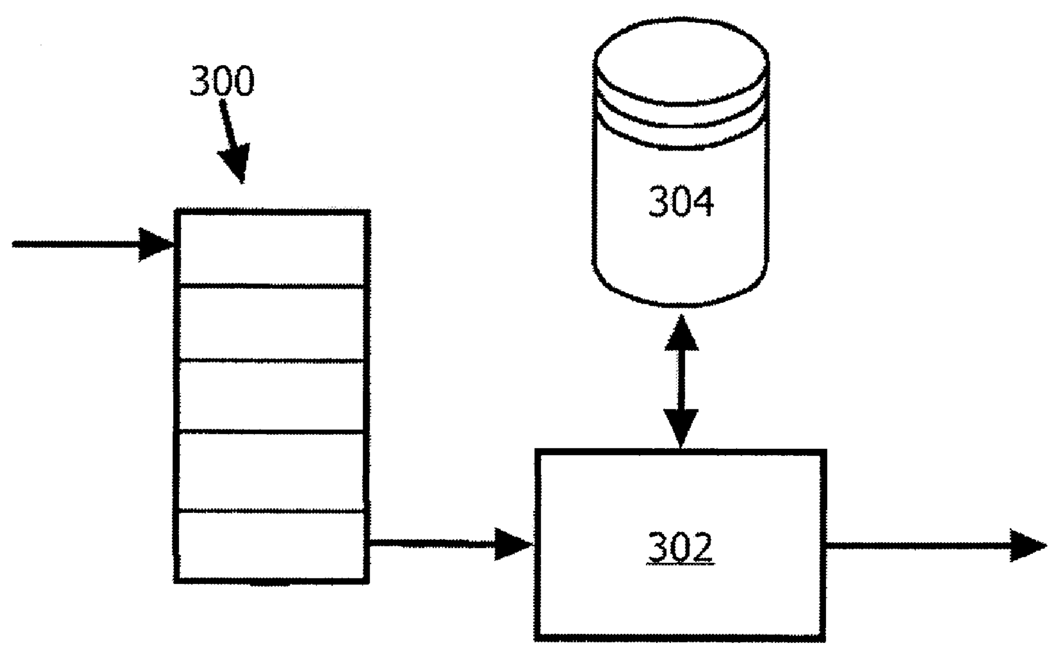
FIG. 3 is a block diagram illustrating an example process flow for compression or decompression of data blocks.

FIG. 3 is a block diagram illustrating a process flow for compression or decompression of data streams. In network environments, a gateway 12, for example, receives data packets from one or more hosts. Data packets destined for a network where a remote gateway (e.g., gateway 14) is deployed can be processed by a compression module residing on gateway 12 and tunneled to gateway 14 for decompression. Gateway 12, in one implementation, buffers received data packets in memory. Conceptually, the compression module, in particular implementations, concatenates the data packets and treats them as a contiguous data stream for purposes of matching segments of the data stream to data block entries in the compression dictionary. Data blocks are entered into a buffer 300 and are processed by module 302 in conjunction with dictionary 304. Dictionary 304 generally refers to the structured database of information used to compress an input data stream, and de-compress a compressed data stream. As the data stream is processed through module 302, new data blocks are entered into the dictionary 304 with the checksums. Dictionary 304 is also utilized to match segments of the input data stream with data block entries in the dictionary 304. In one implementation, the compressor module 302 receives a sequence of bytes up to a minimum number of bytes (i.e., the number of bytes in a data block) and attempts to find a matching data block entry. Data block sizes, in one implementation, are uniform; for example, the data block size may be 1 KB, 2 KB, or 4 KB. Other data block sizes can be used. In addition, in some network implementations, the remote compressing nodes may negotiate the data block size during an initial connection or handshaking phase, and may subsequently renegotiate the data block size at a later time in response to degradations in compression efficiency. The compressor module 302, in one implementation, applies a fixed-size sliding window (matching the block size) to the data stream. If no match is detected, the compressor module 302 slides the window by one byte and attempts to find a matching data block entry. If a threshold number of bytes are accumulated after the trailing edge of the analysis window (typically a fixed data block worth of bytes), or a buffer timeout occurs, the accumulated data block is transmitted without compression. Compressor module 302 replaces matching blocks, however, with signatures. Compressor module 302 may also process the raw data block to create an entry in dictionary 304. In some network implementations, the compressor module 302 may signal the remote decompressor to update its dictionary with a new dictionary entry for the raw data block. In some network implementations, the remote compression modules may also implement an error recovery protocol to synchronize the state of their dictionaries to address lost packets or out of order transmissions.

As discussed above, dictionary 304 generally refers to the data structures that compressor module 302 consults to generate a compressed command data stream. Physically, dictionary 304 is implemented, in one embodiment, by a combination of random access memory (RAM), and a mass storage device (such as a hard drive). However, dictionary 304 may also be implemented using other physical structures, such as a RAM disk. In one implementation, block records with strong checksums are stored on a mass storage device and read into RAM as required. Logically, dictionary 304 comprises a first level hash table, a second level index, and one or more files containing block records and raw data. As discussed herein, compressor module 302 uses weak and strong checksums as references or signatures for corresponding data blocks. Compressor module 302 uses the weak checksum as a first level look up to isolate a subset of data blocks, using the strong checksum to locate matching entries among the isolated subset. In one implementation, dictionary 304 comprises a first level hash table stored in RAM for fast access. In one implementation, the first level hash table stores hashes of weak checksums as indexes to buckets or lists of references to one or more block records. Each block record in a given list or bucket includes a strong checksum associated with a respective data block. Since the weak checksums (or hashes of weak checksums) typically result in collisions, the list may include more than one block record. In some network implementations, each block record may also include a bit map indicating to which remote peer the data block has been sent, and a pointer to the literal data of the data block. In one implementation, the literal data of data blocks is stored in a single file space. Accordingly, the pointer may be an offset value, where the length and file name are derived from the fact that data blocks are uniform in size and the file name is the same for all literal data. Of course, in other implementations, the pointer may also include a file name and/or length to support other data access or structural configurations.

Figure 5:
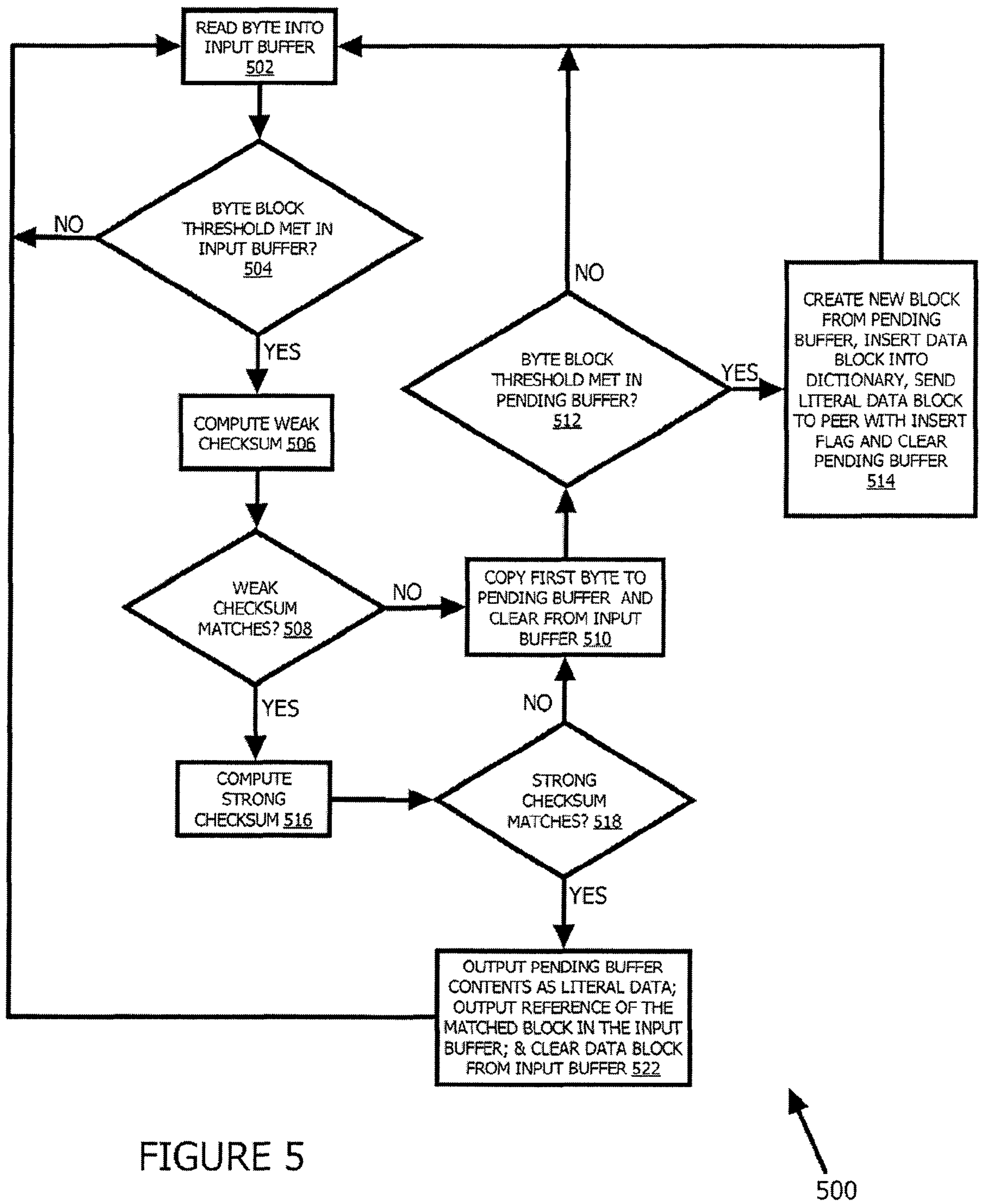
FIG. 5 is a flowchart diagram illustrating a network compression method, in accordance with an example embodiment.

FIG. 5 is a flowchart diagram illustrating a network compression method 500, in accordance with an example embodiment. Method 500 compresses an input data stream into command stream comprising a sequence of signatures, literal data blocks, commands or flags to insert data blocks into a receiver's database and short blocks that are not indexed by either database of the sender and receiver. Method 500 can be executed by a compression module, such the compression module 302 of FIG. 3. Method 500 also utilizes an input buffer and a pending buffer. In one implementation, a size of the input buffer is twice that of a data block size and a size of the pending buffer is a data block size. In one implementation, these buffers can be combined or implemented in a single, circular buffer with pointers to the start and end positions of the input and pending data stored in the circular buffer.

Method 500, in one implementation involves the compression module 302 reading bytes into the input buffer, checking for block matches in a compression dictionary, sending a signature or reference value, instead of the data block, for a match to a receiver (or storage device), creating dictionary entries for data blocks not found in the compression dictionary. In some network implementations, the compression module 302 may send the non-matched blocks to the receiver with a command to enter the block into the receiver's database. Still further, in some implementations, literal or raw data can be compressed using a stateless (e.g., DEFLATE as specified in RFC 1951) or stateful compression algorithm (such as Lempel-Ziv or Huffman compression, or combinations thereof).

In particular implementations, the compression module 302 reads bytes of a data stream into the input buffer (502). When a threshold number of bytes have been read into the input buffer to form a data block (504), the compression module 302 calculates a weak checksum (506) and looks for a match in the first level hash table stored. If the resulting weak checksum does not match an entry in the compression dictionary (508), a leading byte is copied to the pending buffer and cleared from the input buffer (510). A leading byte is the first or oldest byte of the input buffer and the byte that was entered first in comparison to the other bytes in the input buffer.

If enough bytes have accumulated in the pending buffer to form a data block (512), the compression module 302, in one implementation, creates a new data block, calculates weak and strong checksums, enters the data block into the dictionary along with the checksums, sends the data block to the receiver with a command or flag to insert the data block into the receiver's dictionary, and clears the data block from the pending buffer (514). As discussed in more detail below, however, compressor module 302, in an optimization may collect a sequence of data blocks before computing weak and strong checksums and writing dictionary entries into the mass storage device that contains the dictionary to take advantage of locality of reference in subsequent lookup operations.

If the weak checksum has a match in the dictionary (508), the compression module 302 then calculates a strong checksum and accesses the block records in the list or bucket associated with the weak checksum to find a matching strong checksum (516). If there is a match in the dictionary to the strong checksum (518), the compression module 302 sends the contents of the pending buffer as literal or raw data, and sends a signature or reference value, comprising, in one implementation, the weak and strong checksum of the matched data block in the input buffer to the remote peer; and clear the data block from the input buffer. If there is no match to the strong checksum, the compression module 302 copies the first byte to the pending buffer and clears the first byte from the input buffer.

For implementations involving the system architecture illustrated in FIG. 2 (e.g., for use of the compression functionality described herein for data storage), operation 514 of method 500 may be modified to omit the transmission of dictionary synchronization (e.g., "insert") commands or flags. In addition, operation 514 of method 500 can also be modified to output a reference value comprising the weak and strong checksums to the storage device, as opposed to the literal data.

Figure 6:
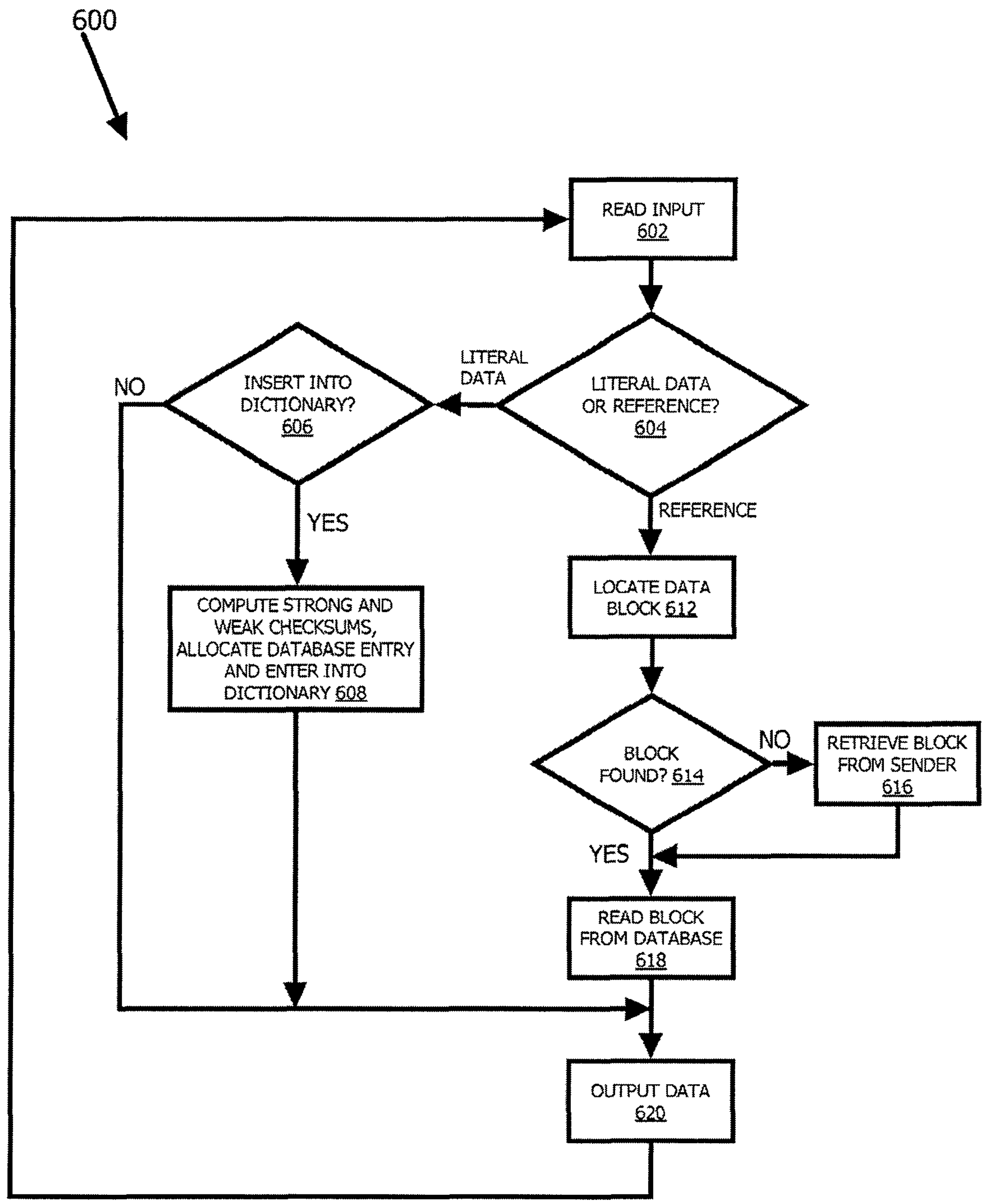
FIG. 6 is a flowchart diagram illustrating a network decompression method, in accordance with an example embodiment.

FIG. 6 is a flowchart diagram illustrating a network decompression method 600, in accordance with an example embodiment. Method 600 can be executed by the compression module 302 and involves a compressed data stream of commands, literal data and references to data blocks. In one implementation, the command stream comprises commands to copy literal data of a given length of bytes onto an output stream, commands to copy data blocks corresponding to appended reference values or signatures, as well as command flags and other parameters directed to dictionary synchronization. In one implementation, the commands may comprise a set of byte or operation codes. The compression module 302, in one implementation, detects literal data and reference values based on appended commands and processes the data stream accordingly.

Beginning at operation 602, the compression module 302 reads the input (from a buffer, for example) and determines if the next command in the input data corresponds to literal data or a reference value of a data block (604). If the command corresponds to literal data, the compression module 302 determines if the literal data is to be inserted as a data block into the receiver's dictionary 304 (606). The compression module 302 makes this determination based on a presence of a command or flag from the sending peer. If yes, the compression module 302 calculates weak and strong checksums for the data block, allocates a database entry (creating an entry in the first level hash table, as well as a data block record) and enters the data block into the dictionary 304 (608). If the results of operation 606 are negative or operation 608 has been completed, the compression module 302 outputs the next N bytes (where N is specified in the command) as literal data (620).

If the command in the input data indicates a reference value (604), the compression module 302 attempts to locate a data block associated with the reference value in the dictionary 304 (612). Similar to the compression side, the compressor module 302 performs a look up, using the weak checksum, in its first level hash table to find a list or bucket of block data records, and then, using the strong checksum, attempts to find a matching data block. If the data block is not found (614), the compression module 302, in one implementation, retrieves the data block from the sending peer as part of a error recovery protocol (616). Otherwise, compressor module 302 reads the data block from its dictionary 304 (618) and outputs the data (620).

For the local storage embodiment, operations 606 and 608 in method 600 may be omitted. Restated, if the input is literal data then the data is simply output. If the input is a reference value, operations 614 and 616, in the data storage case, may be omitted.

In some implementations, the compressor module 302 may implement a process that arranges contiguous sequences (runs) of data blocks on a mass storage device in proximity (locality of reference). Locality of reference is achieved when a given block stored on a mass storage or other memory device is stored in proximity relative to other blocks in a run or contiguous sequence of data blocks, as encountered by the compressor module 302. In one implementation, a separate process or thread handles collecting data blocks in sequences, and delays hashing and insertion of data blocks into the dictionary until a threshold number of data blocks in a run have been collected. For example, the process may wait for 10 blocks, and then process all 10 blocks for entry in the dictionary, writing the literal data of the data blocks sequentially to the mass storage device to achieve locality of reference. Writing the raw data sequentially in the mass storage device allows for various optimizations; for example, upon detection of a first data block, compressor module 302 may pre-cache a corresponding run of data blocks in RAM to potentially increase the data compression speed or efficiency.

Figure 7:
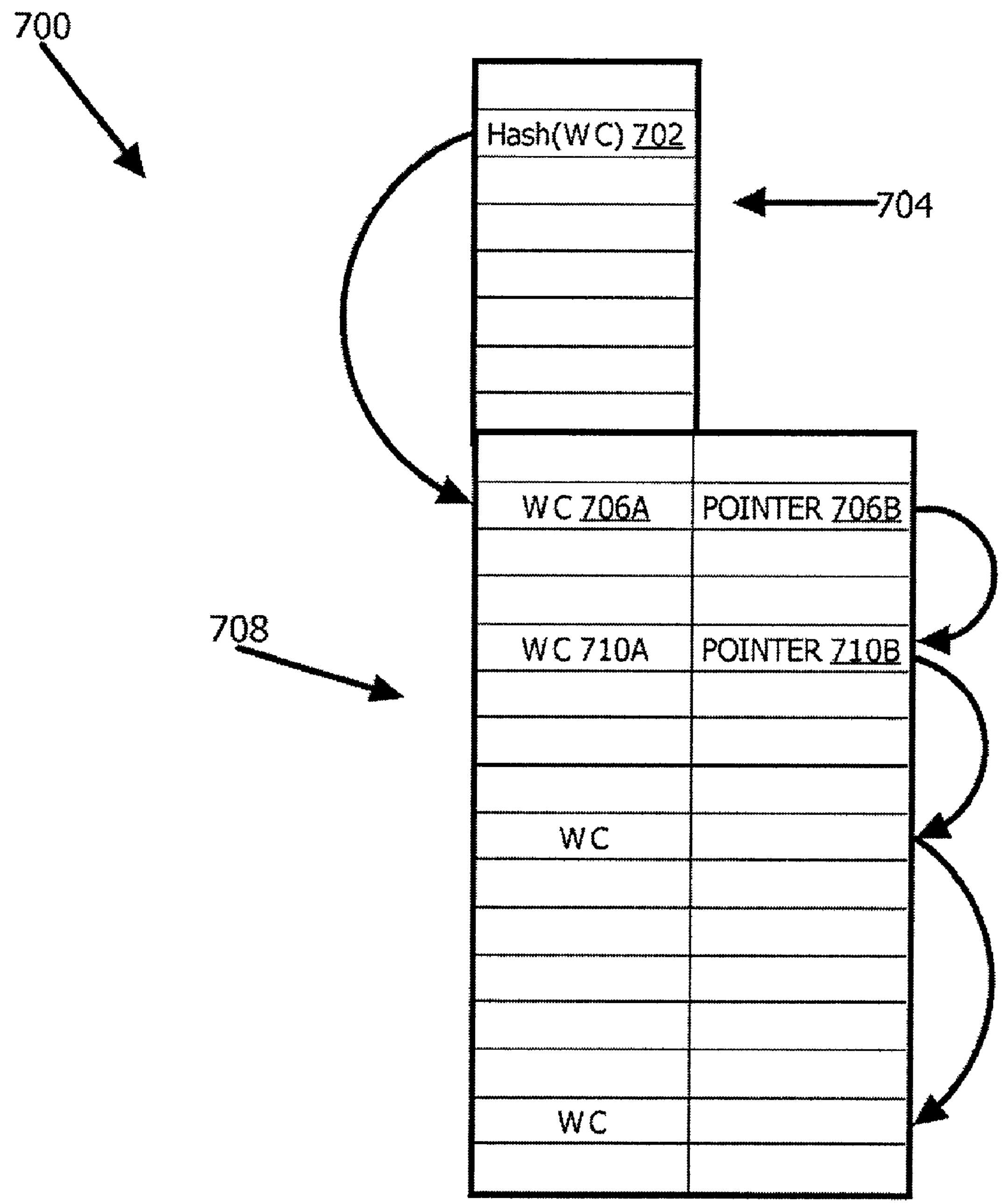
FIG. 7 is a block diagram illustrating an index file, in accordance with an example embodiment.
Figure 8:
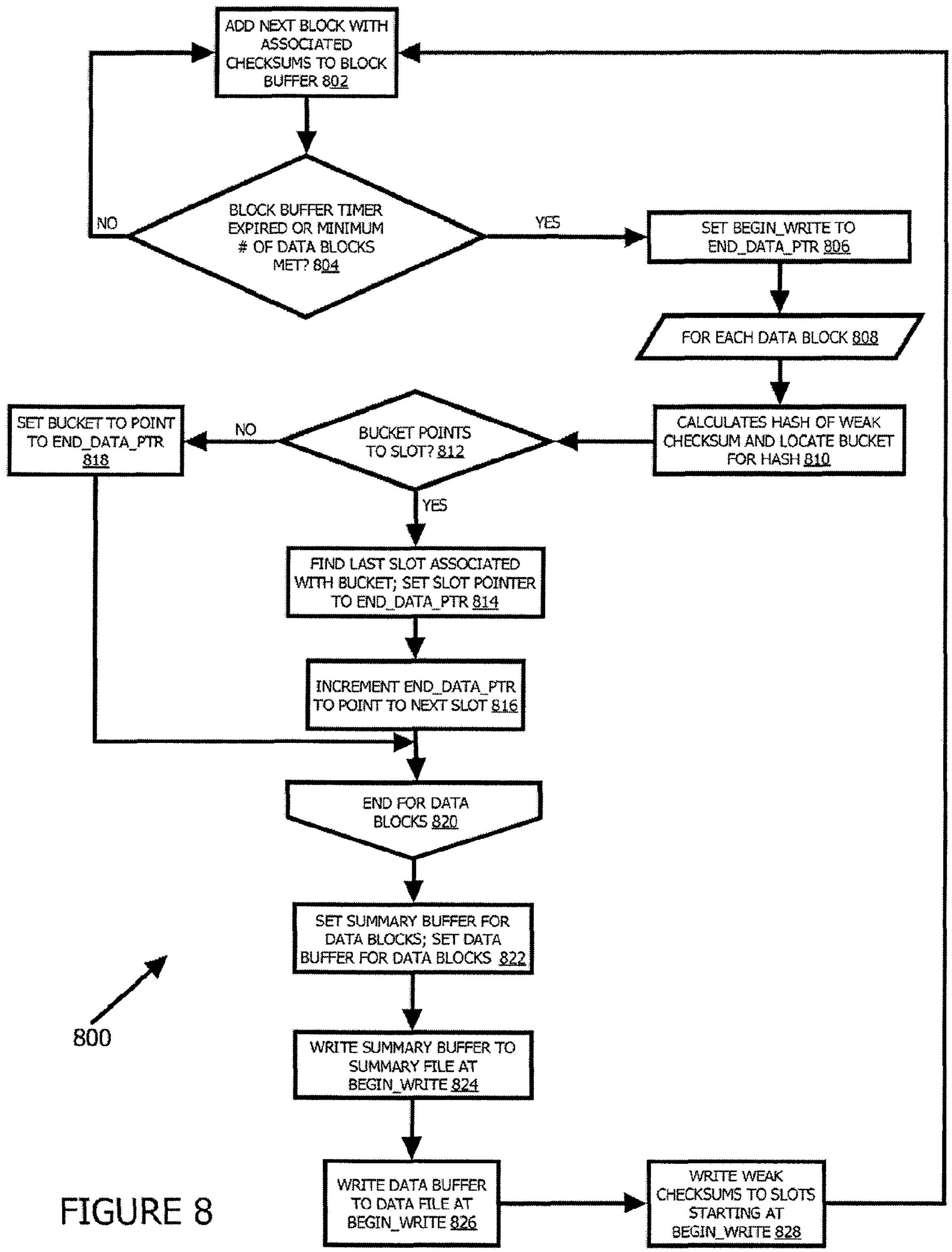
FIG. 8 is a flowchart diagram illustrating a method for inserting data blocks into a hierarchical index, in accordance with an example embodiment.

FIG. 7 is a flowchart diagram illustrating a method 700 for inserting data blocks into a hierarchically-indexed dictionary, in accordance with an example embodiment. The hierarchical dictionary, as described above, includes a first level hash table indexed by hashes of weak checksums. For the purposes of discussing method 700, entries in the first index will now be referred to as buckets and entries in the second index will be referred to as slots. Both indexes are contained in an index file with the first index in an upper part of the index file. In connection with the process illustrated in FIG. 7, operation 514 of FIG. 5 may be modified such that the compressor module 302 passes a data block, as well as strong and weak checksums to a dictionary insertion process, which collects the data blocks and writes them to the dictionary as described below.

As mentioned above and referring to FIG. 7, a bucket, such as bucket 702, is located in an upper portion, generally designated by 704, of an index file 700. Each bucket is a 4-byte pointer to some slot, such as slot 706, in the lower section, generally designated by 708, of the index file 700. Buckets are accessed by a hash of the weak checksum, such as the hashed weak checksum contained in bucket 702. Each slot in the lower section of the index file 700 are composed of an 8 byte weak checksum, such as weak checksum 706A, and a 4 byte pointer, such as pointer 706B, to the next slot, for example 708B, in the chain for the respective bucket at the start of the chain. The entries of the index file 700 map to data block records and corresponding literal data stored in dictionary 403.

In one implementation, when a series of data blocks are inserted by the compression module 302, they are inserted in contiguous slots. However the chains that lead from a given bucket through some number of slots (0 to many) to a given slot with a given weak checksum are randomly distributed. Accordingly, while a given contiguous series of blocks are listed in contiguous order (locality of reference) in the slots, the buckets that lead to those slots are in random locations in the upper section of the index file.

The index file is stored in random access memory for fast access, while a summary file (of data block records) and a data file (of the literal data of the data blocks) are written to persistent storage. The mapping from weak checksum to summary or data block is direct in that they are at the same offset (as adjusted by the differing size of summary or data block size). Searching for a given weak checksum is a random access that is supported by the index being in memory. Each block in turn is added to the end of its chain but its weak check sum is not written. After all the blocks to be inserted are attached to their respective chains, in the index, then the data block record (strong checksum, bitmap, and timestamp) is aggregated in a memory buffer. Also the literal data of the data blocks are likewise aggregated. The summary file info is written with one write, and then the literal data is written with one write. The weak checksums are also filled into their slots for the index file.

In a particular implementation, the compressor module 302 adds a data block with checksums to a block buffer (802) checking to see if an input buffer timer has expired, in one implementation, or if a minimum number of blocks have been met (804). If yes to either condition, depending on the implementation, the compression module 302 sets a BEGIN_WRITE variable equal to END_DATA_PTR (806) which is an index number of a first free slot in the lower portion of the index file. Next, for each block (808), the compression module 302 calculates a weak checksum and locates a bucket for the hash (810). While a bucket points to slot (812), the compressor module 302 finds a last slot associated with the bucket, sets a slot pointer to END_DATA_PTR (814) and increments END_DATA_PTR to point to the next slot (816). After operation 816, the next data block, if there are any remaining in the block buffer is processed until the bucket no longer points to the slot (812) and the compression module 302 sets to the bucket to point to END_DATA_PTR (818) and processing of the data blocks in the block buffer is then complete (820).

Next, the compression module 302 sets up a summary buffer with summary information (strong checksum, bitmap and timestamp) for each data block and a data buffer for each data block (822). In turn, the compression module 302 writes the summary buffer contents to the summary file beginning at BEGIN_WRITE (824), writes the data buffer contents to the data file at BEGIN_WRITE (826) and writes the weak checksums to slots starting at BEGIN_WRITE (828).

Figure 9:
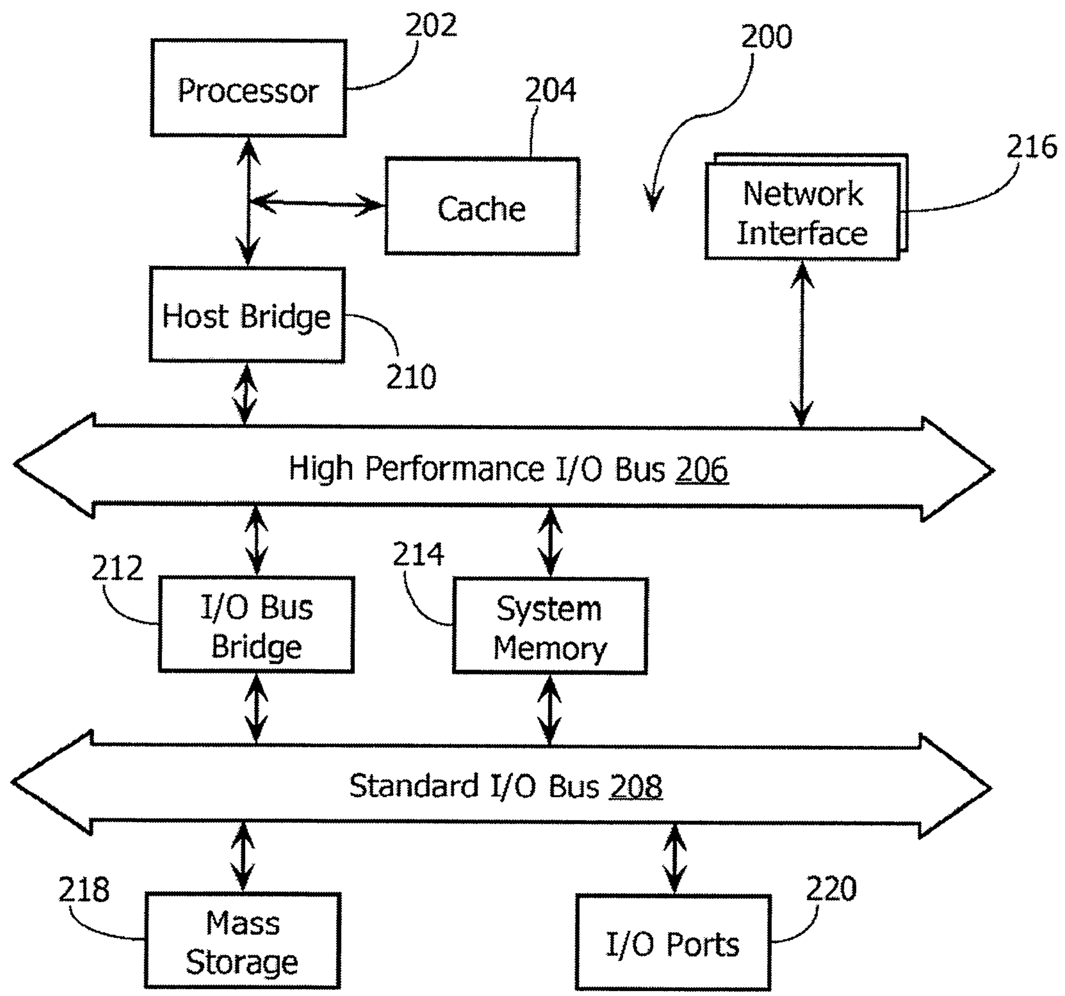
FIG. 9 is a schematic diagram illustrating an example computing system architecture that may be used to implement one or more of client systems.

While the methods of the claimed embodiments have been described above with reference to specific embodiments, some or all of the elements or operations thereof may be implemented using a computer system having a general purpose hardware architecture such as the one in FIG. 9 which illustrates an example hardware system 200, which may be used to implement a gateway 12 or 14 or a host 250 that includes a compression module 252. In one implementation, hardware system 200 comprises a processor 202, a cache memory 204, and one or more software applications and drivers directed to the functions described herein. In one implementation, hardware system 200 includes a high performance input/output (I/O) bus 206 and a standard I/O bus 208. A host bridge 210 couples processor 202 to high performance I/O bus 206, whereas I/O bus bridge 212 couples the two buses 206 and 208 to each other. A system memory 214 and one or more network/communication interfaces 216 couple to bus 206. Hardware system 200 may further include video memory (not shown) and a display device coupled to the video memory. Mass storage 218 and I/O ports 220 couple to bus 208. In one implementation, caches of gateways 12,14 or host 254 may be implemented as a combination of system memory 214 and mass storage 218. A variety of memory management and caching schemes can be used. Hardware system 200 may optionally include a keyboard and pointing device (not shown) coupled to bus 208. Collectively, these elements are intended to represent a broad category of computer hardware systems, including but not limited to general purpose computer systems based on the Pentium® processor manufactured by Intel Corporation of Santa Clara, Calif., as well as any other suitable processor.

Network interface 216 provides communication between hardware system 200 and any of a wide range of networks, such as an Ethernet (e.g., IEEE 802.3) network, etc. Mass storage 218 provides permanent storage for the data and programming instructions to perform the above described functions implemented in the system controller, whereas system memory 214 (e.g., DRAM) provides temporary storage for the data and programming instructions when executed by processor 202. I/O ports 220 are one or more serial and/or parallel communication ports that provide communication between additional peripheral devices, which may be coupled to hardware system 200.

Hardware system 200 may include a variety of system architectures; and various components of hardware system 200 may be rearranged. For example, cache 204 may be on-chip with processor 202. Alternatively, cache 204 and processor 202 may be packed together as a "processor module," with processor 202 being referred to as the "processor core." Furthermore, certain implementations of the present invention may not require nor include all of the above components. For example, the peripheral devices shown coupled to standard I/O bus 208 may couple to high performance I/O bus 206. In addition, in some implementations only a single bus may exist, with the components of hardware system 200 being coupled to the single bus. Furthermore, hardware system 200 may include additional components, such as additional processors, storage devices, or memories.

As discussed above, in one embodiment, the operations of the gateway described herein are implemented as a series of software routines run by hardware system 200. These software routines comprise a plurality or series of instructions to be executed by a processor in a hardware system, such as processor 202. Initially, the series of instructions are stored on a storage device, such as mass storage 218. However, the series of instructions can be stored on any suitable storage medium, such as a diskette, CD-ROM, ROM, EEPROM, etc. Furthermore, the series of instructions need not be stored locally, and could be received from a remote storage device, such as a server on a network, via network/communication interface 216. The instructions are copied from the storage device, such as mass storage 218, into memory 214 and then accessed and executed by processor 202.

An operating system manages and controls the operation of hardware system 200, including the input and output of data to and from software applications (not shown). The operating system provides an interface between the software applications being executed on the system and the hardware components of the system. According to one embodiment of the present invention, the operating system is the Windows® 95/98/NT/XP/Vista operating system, available from Microsoft Corporation of Redmond, Wash. However, the present invention may be used with other suitable operating systems, such as the Apple Macintosh Operating System, available from Apple Computer Inc. of Cupertino, Calif., UNIX operating systems, LINUX operating systems, and the like.

While the claimed embodiments and their various functional components have been described in particular embodiments, it should be appreciated that the claimed embodiments can be implemented in hardware, software, firmware, middleware or a combination thereof and utilized in systems, subsystems, components or sub-components thereof. When implemented in software, the elements of the claimed embodiments are the instructions/code segments to perform the necessary tasks. The program or code segments can be stored in a machine readable medium, such as a processor readable medium or a computer program product, or transmitted by a computer data signal embodied in a carrier wave, or a signal modulated by a carrier, over a transmission medium or communication link. The machine-readable medium or processor-readable medium may include any medium that can store or transfer information in a form readable and executable by a machine (e.g., a processor, a computer, etc.).

Additionally, while a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for compressing data using a hierarchically-indexed database comprising:

accessing a contiguous block of data in an input data stream;

computing a weak checksum of the contiguous block of data;

accessing a first memory storing a first level index of a compression dictionary against the weak checksum to identify an entry associated with a bucket of one or more data block records;

if an entry in the first level index is identified, computing a strong checksum of the block of data and accessing a second level index stored in a second memory to identify a data block record of the identified bucket of data block records having a strong checksum matching the strong checksum of the block of data, wherein the second level index comprises one or more entries, wherein each entry of the second level index maps to a data block record, each data block record comprising a strong checksum and a pointer to a literal data block stored in the second memory; and if a data block record is identified, outputting a reference value for the contiguous block of data.

2. The method of claim 1 wherein the reference value comprises the weak and strong checksums of the contiguous block of data.

3. The method of claim 1 wherein the first memory is dynamic, random access memory and the second memory is a mass storage device.

4. The method of claim 1 wherein the first level index is a hash table.

5. The method as recited in claim 1 further comprising caching one or more entries of the second level index in the first memory.

6. The method of claim 1 wherein accessing the contiguous block is done via a sliding window such that a first byte of the contiguous block is transferred to a pending buffer if the weak checksum does not match the one or more data block records and a new byte of the input data stream is added to an end of the contiguous block from an input buffer.

7. The method of claim 6 wherein bytes in the pending buffer are transmitted as a literal block if a size of the pending buffer meets a block size threshold.

8. The method of claim 1 wherein literal data of the data blocks is stored in a single file space and the pointers of the data block records identify corresponding locations in the single file space.

9. The method of claim 1 wherein each entry of the second level index includes a pointer field for another entry in the second level index.

10. A method for compressing data using a hierarchically-indexed database comprising:

accessing a contiguous block of data in an input data stream;

computing a weak checksum of the contiguous block of data;

accessing a first memory storing a first level index of a compression dictionary against the weak checksum to identify an entry associated with a bucket of one or more data block records;

if an entry in the first level index is identified, computing a strong checksum of the block of data and accessing a second level index of the compression dictionary to locate a data block record of the identified bucket of data block records having a strong checksum matching the strong checksum of the block of data, wherein the second level index comprises one or more entries, wherein each entry of the second level index maps to a data block record, each data block record comprising a strong checksum and a pointer to a literal data block stored in a second memory;

collecting a sequence of contiguous data blocks in the input data stream for which no data block records have been identified; and inserting the contiguous data blocks of the sequence into the compression dictionary, wherein the inserting the contiguous data blocks in the compression dictionary comprises writing literal data of the contiguous data blocks of the sequence to the second memory in proximity.

11. The method of claim 10 wherein the inserting the contiguous data blocks of the sequence is conditionally executed in response to collecting a threshold number of contiguous data blocks.

12. The method of claim 10 wherein the inserting the contiguous data blocks of the sequence is conditionally executed in response to a time out.

13. The method of claim 10 wherein the inserting the contiguous data blocks of the sequence comprises for each contiguous data block in the collected sequence:

computing weak and strong checksums for the contiguous data block;

creating a data block record for the contiguous data block in a buffer space;

then, for all contiguous data blocks of the sequence, writing the data block records in the buffer space and the literal data of the contiguous data block in the second memory.

14. The method of claim 13 wherein the data block records are appended in sequence to an end of a first file, and wherein the literal data of the contiguous data blocks are appended in the sequence to an end of a second file.

15. A method comprising:

accessing an input data stream;

matching contiguous data blocks in the input stream to one or more data block entries of a compression dictionary maintained in a memory;

collecting a sequence of contiguous data blocks in the input data stream to which no entries in the compression dictionary have been matched, wherein the sequence of contiguous data blocks matches an order of the contiguous data blocks in the input data stream; and inserting the contiguous data blocks of the sequence into the compression dictionary maintained in the memory, wherein the inserting the contiguous data blocks in the compression dictionary comprises writing literal data of the contiguous data blocks in proximity according to the collected sequence.

16. The method of claim 15 further comprising if a data block entry is identified, outputting a reference value for the contiguous data block.

17. The method of claim 15 wherein the compression dictionary comprises a first level index, a second level index, one or more data block records and literal data of one or more contiguous data blocks, wherein the first level index comprises one or more entries, wherein each entry of the first level index includes a weak checksum and is associated with one or more data blocks corresponding to the weak checksum;

wherein the second level index comprises one or more entries, wherein each entry of the second level index is associated with a single data block and maps to a data block record maintained in a file space of the compression dictionary; and wherein each data block record of the one or more data block records comprises a strong checksum and a pointer to the literal data of a contiguous data block of the one or more contiguous data blocks.

18. The method of claim 17 wherein the first level index is maintained in a second memory.

19. The method of claim 18 wherein the memory is a mass storage device, and the second memory is a dynamic, random access memory.

20. The method of claim 17 wherein each entry of the second level index includes a field reserved for a pointer to another entry in the second level index that corresponds to a data block record sharing the same weak checksum as the data block record of the entry.

21. The method of claim 17 wherein the entries of the second level index comprises one or more linked lists each corresponding to a given weak checksum.

22. The method of claim 17 wherein the first level index is a hash table.

23. The method of claim 15 wherein the inserting the contiguous data blocks of the sequence is conditionally executed in response to collecting a threshold number of contiguous data blocks.

24. The method of claim 15 wherein the inserting the contiguous data blocks of the sequence is conditionally executed in response to a time out.

25. The method of claim 17 wherein the inserting the contiguous data blocks of the sequence comprises for each contiguous data block in the collected sequence:

computing weak and strong checksums for the contiguous data block;

creating a data block record for the contiguous data block in a buffer space;

then, for all contiguous data blocks of the sequence, writing the data block records in the buffer space and the literal data of the contiguous data block in the memory.

26. The method of claim 25 wherein the data block records are appended to an end of a first file, and wherein the literal data of the contiguous data blocks are appended in the sequence to an end of a second file.

27. The method of claim 26 wherein the data block records are appended to the end of the first file in the order of the corresponding contiguous data blocks in the input data stream.

28. The method of claim 26 wherein the literal data of the contiguous data blocks are appended to the end of the second file in the order of the contiguous data blocks in the input data stream.

29. The method of claim 15 wherein the inserting the contiguous data blocks of the sequence comprises for each contiguous data block in the collected sequence:

computing one or more checksums for the contiguous data block;

creating a data block record for the contiguous data block in a buffer space;

then, for all contiguous data blocks of the sequence, writing the data block records in the buffer space and the literal data of the contiguous data block in the memory.

30. The method of claim 29 wherein the data block records are appended to an end of a first file, and wherein the literal data of the contiguous data blocks are appended in the sequence to an end of a second file.

31. The method of claim 30 wherein the data block records are appended to the end of the first file in the order of the corresponding contiguous data blocks in the input data stream.

32. The method of claim 30 wherein the literal data of the contiguous data blocks are appended to the end of the second file in the order of the contiguous data blocks in the input data stream.

33. An apparatus comprising:

one or more processors;

one or more network interfaces;

a memory;

a software application, physically stored in the memory, comprising computer readable instructions operable, when executed, to cause the one or more processors and the apparatus to:

access an input data stream;

match contiguous data blocks in the input stream to one or more data block entries of a compression dictionary maintained in a memory;

collect a sequence of contiguous data blocks in the input data stream to which no entries in the compression dictionary have been matched, wherein the sequence of contiguous data blocks matches an order of the contiguous data blocks in the input data stream; and insert the contiguous data blocks of the sequence into the compression dictionary maintained in the memory, wherein the inserting the contiguous data blocks in the compression dictionary comprises writing literal data of the contiguous data blocks in proximity according to the collected sequence.

* * * * *